(12) United States Patent
Chang et al.

(10) Patent No.: US 11,553,625 B2
(45) Date of Patent: Jan. 10, 2023

(54) TOOL-LESS M.2 DEVICE CARRIER WITH GROUNDING AND THERMAL FLOW

(71) Applicant: Quanta Computer Inc., Taoyuan (TW)

(72) Inventors: Chun Chang, Taoyuan (TW);
Shih-Hsuan Hu, Taoyuan (TW);
Wei-Cheng Tseng, Taoyuan (TW);
Cheng-Feng Tsai, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 196 days.

(21) Appl. No.: 16/950,551

(22) Filed: Nov. 17, 2020

(65) Prior Publication Data
US 2022/0030748 A1    Jan. 27, 2022

Related U.S. Application Data

(60) Provisional application No. 63/055,713, filed on Jul. 23, 2020.

(51) Int. Cl.
*H05K 7/20*   (2006.01)
*H05K 7/14*   (2006.01)

(52) U.S. Cl.
CPC ....... *H05K 7/20709* (2013.01); *H05K 7/1402* (2013.01); *H05K 7/2039* (2013.01)

(58) Field of Classification Search
CPC . G06F 1/185; G06F 1/20; G06F 1/186; G06F 1/187; G06F 1/183; G06F 13/409; H05K 2201/10159; H05K 3/301; H05K 7/1487; H05K 1/0203; H05K 2201/10598; H05K 5/0221; H05K 7/1405;
(Continued)

(56) References Cited

U.S. PATENT DOCUMENTS

| | | | |
|---|---|---|---|
| 6,082,440 A * | 7/2000 | Clemens | H01L 23/4093 174/16.3 |
| 6,636,424 B2 * | 10/2003 | Lee | H01L 23/4093 361/705 |
| 9,778,708 B1 * | 10/2017 | Meserth | H01R 12/721 |

(Continued)

FOREIGN PATENT DOCUMENTS

| | | | | |
|---|---|---|---|---|
| CN | 208157072 U | * | 11/2018 | G06F 1/20 |
| CN | 209118224 U | * | 7/2019 | G06F 1/20 |

(Continued)

OTHER PUBLICATIONS

Yu Wei et al. CN 208157072, Radiating assembly, Nov. 27, 2018, Espacenet English Translation (Year: 2018).*

*Primary Examiner* — Michael A Matey
(74) *Attorney, Agent, or Firm* — Nixon Peabody LLP

(57) ABSTRACT

A carrier for different electronic components for installation in an expansion card for a computing device is disclosed. The carrier conforms to M.2 standards such as an M.2 22110 form factor. The carrier has a top heat sink and a bottom heat sink. A circuit board includes the electronic device. The circuit board is seated between the top heat sink and the bottom heat sink. A side clip includes a top panel and a bottom panel. The side clip has an open position and a closed position. When the side clip is in the closed position, the top panel of the side clip contacts the top heat sink, and the bottom panel of the side clip contacts the bottom heat sink, to hold the top heat sink to the bottom heat sink.

20 Claims, 7 Drawing Sheets

(58) Field of Classification Search
CPC .... H01L 23/4093; F16B 21/02; F16B 37/043; G11C 5/04
See application file for complete search history.

(56) References Cited

U.S. PATENT DOCUMENTS

| | | | | |
|---|---|---|---|---|
| 10,152,097 B1* | 12/2018 | Huang | ................ | H01L 23/4006 |
| 10,299,397 B1* | 5/2019 | Chen | ........................ | G06F 1/184 |
| 10,394,291 B2* | 8/2019 | Kho | ........................ | H05K 1/117 |
| 10,674,621 B1* | 6/2020 | Tsorng | ................ | H05K 5/0291 |
| 10,806,056 B2* | 10/2020 | Cuda | ................. | H05K 7/20763 |
| 2003/0156386 A1* | 8/2003 | Summers | ............. | H05K 1/0204 |
| | | | | 29/890.03 |
| 2006/0012959 A1* | 1/2006 | Lee | ........................... | G06F 1/20 |
| | | | | 361/699 |
| 2007/0195489 A1* | 8/2007 | Lai | ........................ | G11C 5/143 |
| | | | | 361/600 |
| 2008/0013282 A1* | 1/2008 | Hoss | ................... | H01L 23/4093 |
| | | | | 257/E23.086 |
| 2008/0174965 A1* | 7/2008 | Hsu | ....................... | H05K 7/2049 |
| | | | | 361/704 |
| 2009/0040729 A1* | 2/2009 | Deng | ................... | H01L 23/4093 |
| | | | | 248/510 |
| 2009/0122481 A1* | 5/2009 | Chang | ................... | H01L 23/467 |
| | | | | 361/679.54 |
| 2009/0190304 A1* | 7/2009 | Meyer, IV | ................ | G06F 1/20 |
| | | | | 361/679.47 |
| 2013/0182389 A1* | 7/2013 | Demange | ................... | G06F 1/20 |
| | | | | 361/679.54 |
| 2016/0335220 A1* | 11/2016 | Breakstone | ......... | G06F 13/4068 |
| 2017/0371383 A1* | 12/2017 | Yang | ...................... | F16B 5/0635 |
| 2018/0373664 A1* | 12/2018 | Vijayrao | ............. | G06F 13/4068 |
| 2019/0174618 A1* | 6/2019 | Chen | ........................ | G06F 1/185 |
| 2020/0200216 A1* | 6/2020 | Wang | ...................... | F16B 21/02 |
| 2020/0389975 A1* | 12/2020 | Lai | ........................... | G06F 1/185 |
| 2021/0349504 A1* | 11/2021 | Tsorng | .................... | G06F 1/186 |

FOREIGN PATENT DOCUMENTS

| | | | |
|---|---|---|---|
| CN | 112698705 A | * | 4/2021 |
| TW | M612539 U | * | 12/2020 |

* cited by examiner

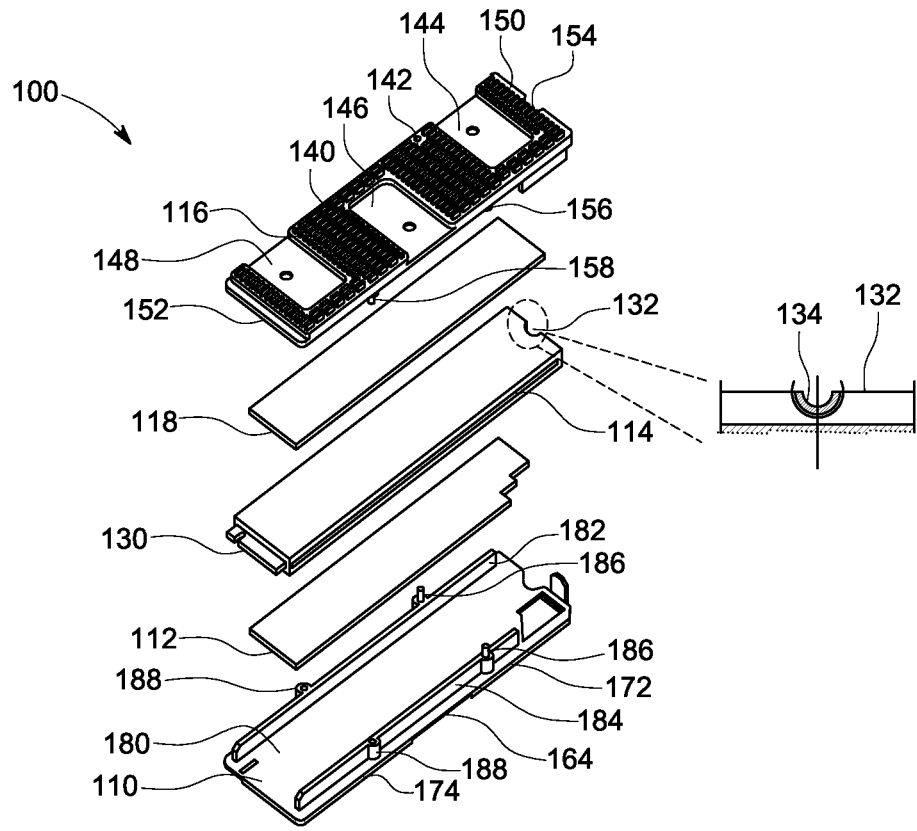
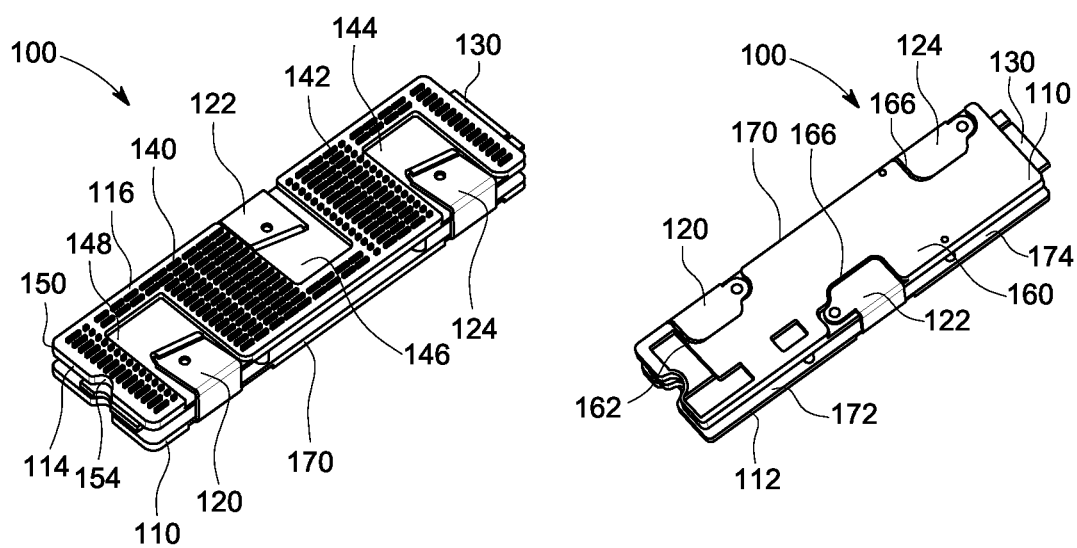
FIG. 1A
FIG. 1B
FIG. 1C

TOOL-LESS M.2 DEVICE CARRIER WITH GROUNDING AND THERMAL FLOW

PRIORITY CLAIM

This application claims priority under 35 U.S.C. § 119 to U.S. Provisional Application No. 63/055,713, filed on Jul. 23, 2020. The contents of that application are hereby incorporated by reference in their entirety.

TECHNICAL FIELD

The present disclosure relates generally to a carrier of high capacity electronic components for an expansion card that may be inserted into modular slots in a server sled. More particularly, aspects of this disclosure relate to a tool less carrier with heat transfer efficiency for insertion in an expansion card.

BACKGROUND

Electronic devices, such as servers, include numerous electronic components that are powered by a common power supply. Generally, servers are directed toward specific functions such as storing large amounts of data or processing. Server design begins with a chassis that includes power components and general controllers such as a baseboard management controller. Current large server designs include slots for server sleds that have processors, memory, power and network interfaces. Such sleds in turn include expansion slots that accept expansion device cards that may be plugged in to perform additional server functions, such as storage or processing. For example, a storage server sled may include slots for accommodating additional solid state drive (SSD) device cards while a processing server may include slots for more device cards with processing units.

Servers generate enormous amounts of heat due to the operation of internal electronic devices such as controllers, processors, and memory as well as the components on such device cards. Thus, servers are designed to rely on air flow through the interior of the device to carry away heat generated from electronic components. The heat generation increases when components such as memory devices increase in size. Expansion card carriers for electronic components often have heat sinks to draw heat away from the electronic components. Heat sinks are typically composed of thermally conductive material. Heat sinks absorb the heat from the electronic components, thus transferring the heat away from the components. The challenge of heat removal increases with each generation of card devices, as each generation becomes more powerful, thereby generating more heat.

As explained previously, storage server sleds may include solid state drive (SSD) based expansion cards to increase storage capability. The current generation of SSD cards are based on carriers for the memory chips following the M.2 form factor standard, such as the M.2 22110. Thus, carriers are specifically designed to hold components that are designed based on the M.2 form factor. For example, the M.2 22110 mechanical specification has a top side component area that is approximately 22 mm by 110 mm with a golden finger type connector at one end. The carriers are inserted in expansion cards. Such expansion cards are often mounted on riser brackets, that are in turn mounted parallel to the motherboard of a server sled. In this manner, multiple expansion cards may be mounted in a spatially efficient manner on a server sled.

Next generation storage cards generally favor the larger M.2 carrier dimensions to accommodate greater storage capability in SSD devices. Currently, having additional higher capacity on M.2 devices for expanded storage capability such as 1 TB, 2 TB, 4 TB, 8 TB, or 16 TB, requires a higher thermal design power from 6.8 W to 18 W. Due to the expected increase in storage capacity, current carriers may not be able to accommodate future SSD devices because of thermal issues that cannot be addressed by currently designed carrier heat sinks.

Thus, there is a need for a carrier which accommodates high thermal output components such as SSDs. There is another need for a toolless mechanism to assemble and secure the electronic components of a carrier. There is also a need for a carrier with more efficient heat dissipation from higher storage and thermal power SSD components for expansion cards, such as PCIe expansion cards.

SUMMARY

One disclosed example is a carrier for an electronic device installable in an expansion card. The carrier includes a top heat sink and a bottom heat sink. A circuit board including the electronic device is seated between the top heat sink and the bottom heat sink. A side clip includes a top panel and a bottom panel. The side clip has an open position and a closed position. When the side clip is in the closed position the top panel of the side clip contacts the top heat sink, and the bottom panel of the side clip contacts the bottom heat sink. The side clip holds the top heat sink to the bottom heat sink.

In another implementation of the disclosed example carrier, the top heat sink includes an exterior surface having a plurality of fins. In another implementation, the top heat sink includes a first edge having a cutout mateable to a latch on an expansion card. The top heat sink includes a second edge including a circuit connector mateable with a connector socket on the expansion card. In another implementation, the top heat sink and the bottom heat sink are fabricated from aluminum alloy. In another implementation, the circuit board is compliant with an M.2 form factor. In another implementation, the electronic device is a solid state drive (SSD). In another implementation, the carrier includes a second side clip located on the opposite side of the first side clip. The second side clip has an open position and a closed position. When the second side clip is in the closed position, the top panel of the second side clip contacts the top heat sink, and the bottom panel of the second side clip contacts the bottom heat sink. The second side clip holds the top heat sink to the bottom heat sink. In another implementation, the first side clip includes a hinge coupled to the bottom heat sink. The first side clip rotates around the hinge between the open and closed position. In another implementation, the carrier includes a top thermal pad between the circuit board and the top heat sink. The carrier includes a bottom thermal pad between the circuit board and the bottom heat sink. In another implementation, the bottom heat sink includes two side walls. The side walls are arranged to hold the circuit board in a lateral orientation.

Another disclosed example is an expansion card for insertion in an expansion slot of a server sled. The expansion card includes a support board and a connector socket on one side of the support board. A latch member is on the opposite side of the support board. The connector socket and the latch member accommodate an M.2 compliant carrier of an electronic device. The carrier includes a top heat sink and a bottom heat sink. The carrier has a circuit board including the electronic device seated between the top heat sink and the bottom heat sink. The carrier has a first and a second side clip. Each of the side clips includes a top panel and a bottom panel. The side clips have an open position and a closed position. When the side clips are in the closed position, the top panel of the side clips contact the top heat sink, and the bottom panel of the side clips contact the bottom heat sink. The side clips hold the top heat sink to the bottom heat sink.

In another implementation of the disclosed example expansion card, the support board includes an edge connector for connection to the expansion slot on the server sled. In another implementation, the expansion slot is a PCIe slot. In another implementation, the top heat sink includes a first edge having a cutout, and a second edge including a circuit connector mateable to the socket connector. In another implementation, the latch member includes a slidable latch that engages the cutout of the top heat sink. In another implementation, the top heat sink and the bottom heat sink are fabricated from aluminum alloy. In another implementation, the electronic device is a solid state drive (SSD). In another implementation, the side clips each include a hinge coupled to one side of the bottom heat sink. The side clips rotate around the hinge between the open and closed position. In another implementation, the carrier further includes a top thermal pad between the circuit board and the top heat sink, and a bottom thermal pad between the circuit board and the bottom heat sink. In another implementation, the bottom heat sink includes two side walls. The side walls are arranged to hold the circuit board in a lateral orientation.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIG. 1A shows an exploded perspective view of the components of an example M2 form factor carrier;

FIG. 1B is a top perspective view of the assembled example carrier in FIG. 1A;

FIG. 1C is a bottom perspective view of the assembled example carrier in FIG. 1B;

Figure 2A:
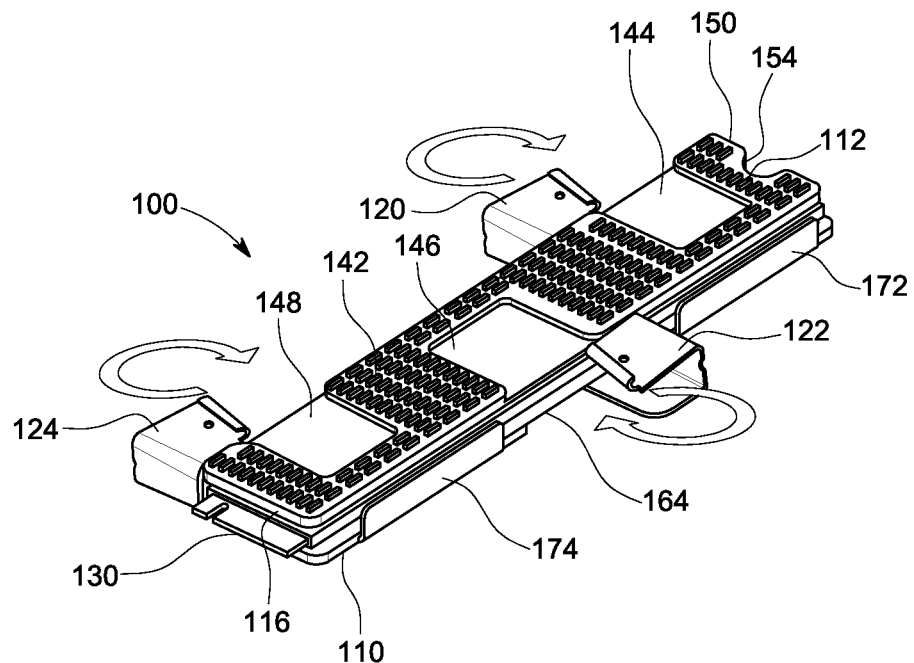
FIG. 2A is a view of the assembled carrier showing binding clips rotated in an open position to allow assembly of the components in FIG. 1A.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed toward an example M2 carrier with two heat sinks and rotatable clips that ensure that both heat sinks have good contact with thermal pads to allow electronic components that have high thermal power. The M.2 carrier described herein may be mounted in an expansion card that accommodates four carriers.

FIG. 1A is an exploded view of the components of an example carrier 100 that conforms with the M.2 22110 form factor standard. Thus, the carrier accommodates an M.2 type component card have a 22×110 mm footprint. FIG. 1B is a top perspective view of the assembled example carrier 100. FIG. 1C is a bottom perspective view of the assembled example carrier 100. FIG. 2A is a view of the assembled carrier 100 showing side clips rotated in an open position to allow assembly of the components in FIG. 1.

As shown in FIG. 1A, the carrier 100 includes a bottom heat sink 110, a bottom thermal pad 112, a circuit board 114, a top heat sink 116, and a top thermal pad 118. In this example, the circuit board 114 conforms with the dimensions for an M.2 22110 carrier. The circuit board 114 in this example includes electronic components such as a non-volatile memory solid state drive (NVME SSD). Other types of cards, such as a Samsung PM983 type SSD or an Intel P4511 3D NAND drive, may also use the carrier 100. The circuit board 114 is seated between the bottom heat sink 110 and the top heat sink 116 when the carrier 100 is assembled. In this example, both of the heat sinks 110 and 116 are fabricated from aluminum alloy for a high K factor, but other appropriate heat conducting materials may be used.

As shown in FIGS. 1B-1C, three side clips 120, 122, and 124 attach the top heat sink 116, top thermal pad 118 (FIG. 1A), bottom heat sink 110, circuit board 114, and bottom thermal pad 112 to each other to form the assembled carrier 100. Each of the clips 120, 122, and 124 have a general "U"

shape and provide compressive force to the top heat sink 116 and bottom heat sink 110. As will be explained, the side clips 120, 122, and 124 may be rotated away from the bottom heat sink 110 to allow the other components of the carrier 100 to be removed. When the side clips 120, 122, and 124 are rotated to a closed position, they join the top heat sink 116, top thermal pad 118, bottom heat sink 110, circuit board 114, and bottom thermal pad 112. The circuit board 114 rests on the bottom thermal pad 112 and is similarly positioned and restrained from lateral movement by the side clips 120, 122, and 124 and the bottom heat sink 110. The circuit board 114 may include electronic components such as solid state memory chips and supporting circuitry. A connector edge 130 extends from one end of the circuit board 114. The connector edge 130 may include golden-finger type connectors. An opposite edge 132 (FIG. 1A) includes a semi-circular cutout 134 that is bordered by a conductive material to serve as a mechanical ground pad.

The top heat sink 116 includes a bottom surface that is placed in contact with the top thermal pad 118 to transfer heat generated by the electronic components of the circuit board 114. The top heat sink 116 has an exterior surface 140 that includes a pattern of fins 142 that extend from the exterior surface 140. The fins 142 assist in dissipating heat by increasing the surface area of the exterior surface 140, allowing greater dissipation of heat. The fins 142 are generally fabricated over the entire exterior surface 140 except for three flat edge areas 144, 146, and 148. The flat edge areas 144, 146, and 148 each have a shape matching the respective clips 120, 122, and 124. The exterior surface 140 has opposite end edges 150 and 152. A semi-circular cutout 154 is formed in one of the end edges 150. The top heat sink 116 includes registration features to allow alignment when attached to the bottom heat sink 110. In this example, the top heat sink 116 includes two female registration features 156 (one on each side in proximity to the end edge 150) and two male registration features 158 (one on each side in proximity to the end edge 152).

As shown in FIGS. 1A, 1C and FIG. 2A, the bottom heat sink 110 includes a bottom surface 160 that is generally flat. Three recesses 162, 164, and 166 are formed on the edges of the bottom surface 160. The bottom heat sink 110 includes a middle side edge 170 and two opposite side edges 172 and 174 offset from each other. The clips 122 and 124 are located on either side of the middle side edge 170 that defines one end of the recesses 162 and 166. The clip 124 is located between the side edges 172 and 174 on the other side that define the recess 164.

An opposite top surface 180 (FIG. 1A) of the bottom heat sink 110 includes two side walls 182 and 184 (FIG. 1A) that are arranged parallel to each other near the edges of the top surface 180. The two side walls 182 and 184 allows the alignment of the bottom thermal pad 112 and the circuit board 114 (FIG. 1B). The side walls 182 and 184 constrain lateral movement of the circuit board and the bottom thermal pad 112. In this example, the side walls 182 and 184 includes two male registration features 186 (FIG. 1A) and two female registration features 188 (FIG. 1A). When the bottom heat sink 110 is attached to the top heat sink 116, the male registration features 186 are mated with the female registration features 156 (FIG. 1A) of the top heat sink 116, while the female registration features 188 are mated with the male registration features 158 (FIG. 1A) of the top heat sink 116.

Figure 2B:
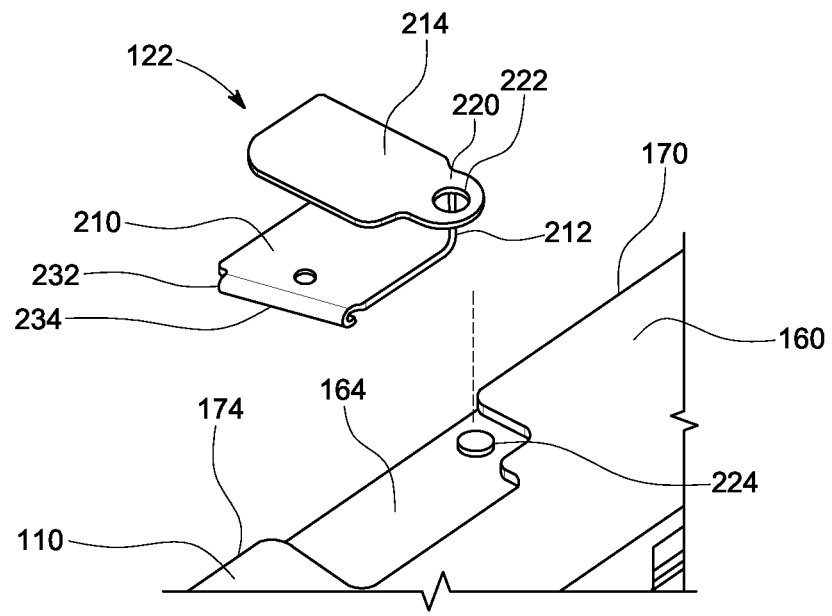
FIG. 2B is a perspective view of one of the clips in FIGS. 1B-1C.

The clips 120, 122, and 124 in this example are fabricated from stainless steel, but any flexible material with sufficient tensile strength may be used. FIG. 2B is a bottom perspective view of the side clip 122 in FIGS. 1B-1C in relation to the bottom heat sink 110. The clip 122 is identical to the clips 120 and 124. For purposes of explanation, the elements of the clip 122 are shown in FIG. 2B, but it is to be understood that the below description relates to the identical clips 120 and 124. The clip 122 include a top panel 210 that has the same shape as the flat edge area 146 formed on the exterior surface 140 of the top heat sink 116 in FIG. 2A. A bottom panel 214 is joined by a joining member 212 to the top panel 210 to form the "U" shape. The bottom panel 214 is shaped to conform to the shape of the recess 164 on the bottom heat sink 110. The width of the bottom panel 214 fits between the edges 172 (FIG. 2A) and 174. The bottom panel 214 includes an extension tab 220 with a hole 222. The hole 222 is mated with a pin 224 formed in the recess 164 of the bottom surface 160 of the bottom heat sink 110. The hole 222 of the extension tab 220 is inserted on the pin 224, which acts as a hinge. Thus, the clip 122 can rotate between an open position shown in FIG. 2A and a locked position shown in FIGS. 1B-1C. In the closed position, the top panel 210 contacts the top heat sink 116 while the bottom panel 214 contacts the bottom heat sink 110. The side clip 122 therefore joins the top heat sink 116 to the bottom heat sink 110. The side clip 122 provides compressive force to the heat sinks 110 and 116 in the closed position. The top panel 210 includes an exterior edge 232 that forms a semi-cylindrical member 234 that allows a user to manipulate the clip 122. There are three clips in this example, but other numbers of clips may be used. For example, one clip on each side may be used or two clips on each side may be used. The three clip arrangement provides consistent force on the top heat sink 116 and the bottom heat sink 110 to engage the components on the circuit board 114 and thus facilitate thermal conductivity.

Figure 3A:
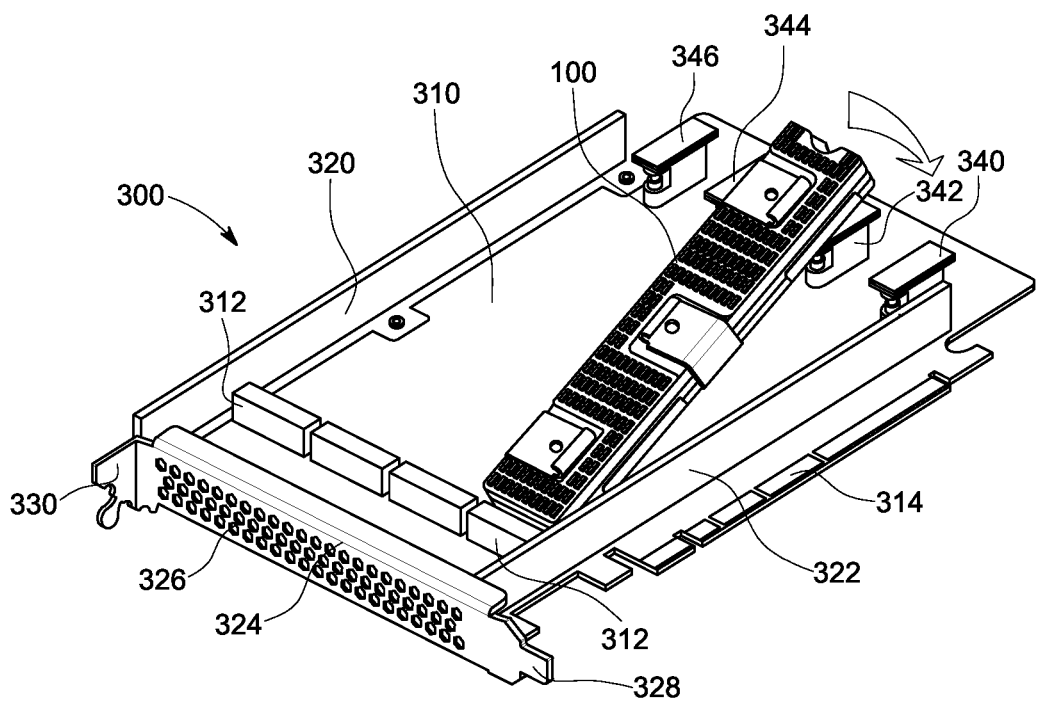
FIG. 3A is a perspective view of the installation of the carrier in FIG. 1A in an example expansion card.

FIG. 3A is a perspective view of the installation of the M.2 type carrier 100 in FIG. 1A to an expansion card 300. The expansion card 300 in this example may accommodate up to four M.2 22110 carriers such as the carrier 100. The M.2 22110 carriers hold electronic components such as solid-state drives (SSDs). In this example, the card 300 is an OCP AVA-4 M.2 carrier card that is a PCIe Full Height Half Length (FHHL) form factor card available from Quanta Computing. The card 300 includes a support circuit board 310 with a set of connector sockets 312 for each of the four M.2 carriers.

The support circuit board 310 has an edge connector 314 that allows the card 300 to be attached to a connector on a riser board. The edge connector 314 may have golden finger connectors. The card 300 includes two side walls 320 and 322. A front wall 324 joins the two side walls 320 and 322. The front wall 324 includes a grill 326 that allows air flow to the carriers. The front wall 324 holds an extension tab 328 that may be used to position the card 300 in a computing device. A latch mechanism 330 is supported by the side wall 320 to allow the attachment of the card 300 to a riser board. The support circuit board 310 includes four latch members 340, 342, 344, and 346 that are each located opposite to one of the connector sockets 312.

Figure 3B:
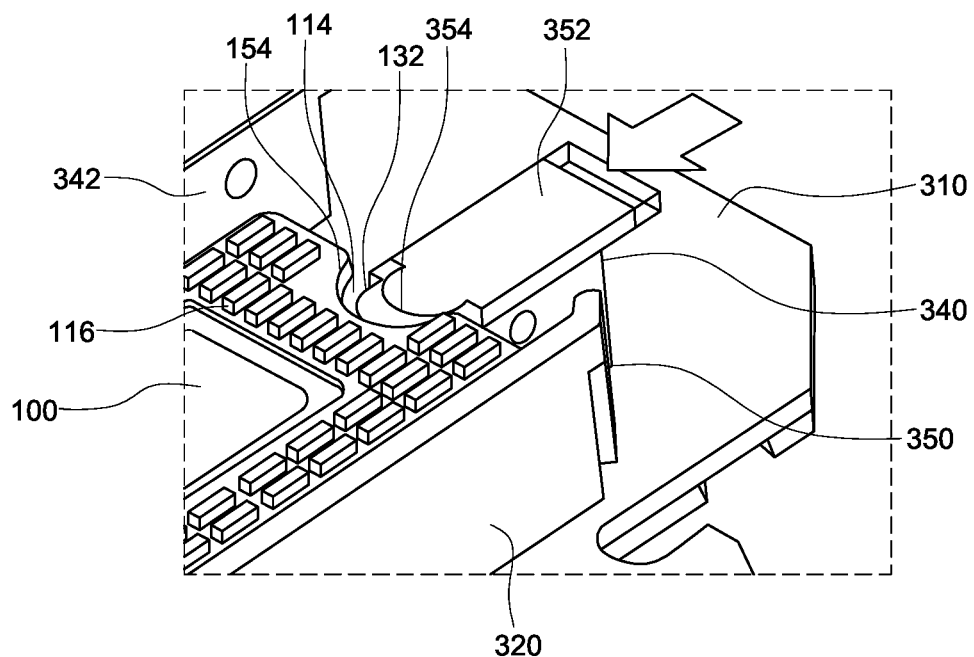
FIG. 3B is a close-up perspective view of a latch of the expansion card in FIG. 3A that secures one of the carriers.

FIG. 3B is a close up perspective view of the latch member 340 supported by the support circuit board 310. Like elements are labeled with like reference numbers as their counterparts in FIG. 3A. The latch member 340 includes a support 350 that is the height of the carrier 100. One end of the support 350 is attached to the support circuit board 310. The other end of the support 350 holds a slidable metal latch 352. The metal latch 352 has an open position that is retracted away from the carrier 100 and a closed position toward the carrier 100. The metal latch 352 in this example is spring biased by a spring in the support 350 to the closed position. One end of the metal latch 352 has a semi-circular end tab 354.

The connector edge 130 of the carrier 100 is attached to one of the connector sockets 312 on one end of the support circuit board 310 in FIG. 3A. The other end of the carrier 100 includes the semi-circular cutout 154 in the top heat sink 116. The cutout 154 accommodates the shape of the end tab 354 of the metal latch 352. The latch 352 is pulled out to compress the internal spring. When the latch 352 is pulled out to the open position, the carrier 100 may be inserted between the connector socket 312 (in FIG. 3A) and the support 350. Once the carrier 100 is inserted, the latch 352 is forced forward by the spring so the end tab 354 mates with the cutout 154. In the closed position, the bottom of the end tab 354 of the latch 352 is in contact with the conductive material around the semi-circular cutout 134 (in FIG. 1A) in the circuit board 114 to ground the circuit board 114. Thus, mechanical grounding is provided by the contact between the end tab 354 and the conductive material on the circuit board 114. The latch 352 holds the carrier 100 in place through the contact of the end tab 354 to the cutout 154.

Figure 4A:
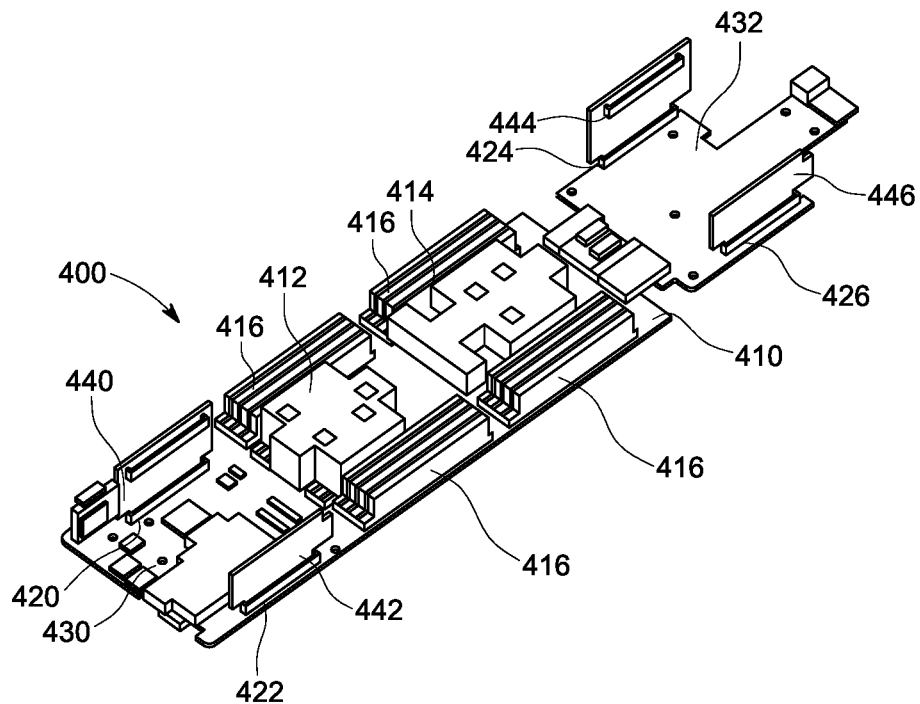
FIG. 4A is an example server sled that includes different expansion card slots that hold expansion cards such as the card in FIG. 3A.
Figure 4B:
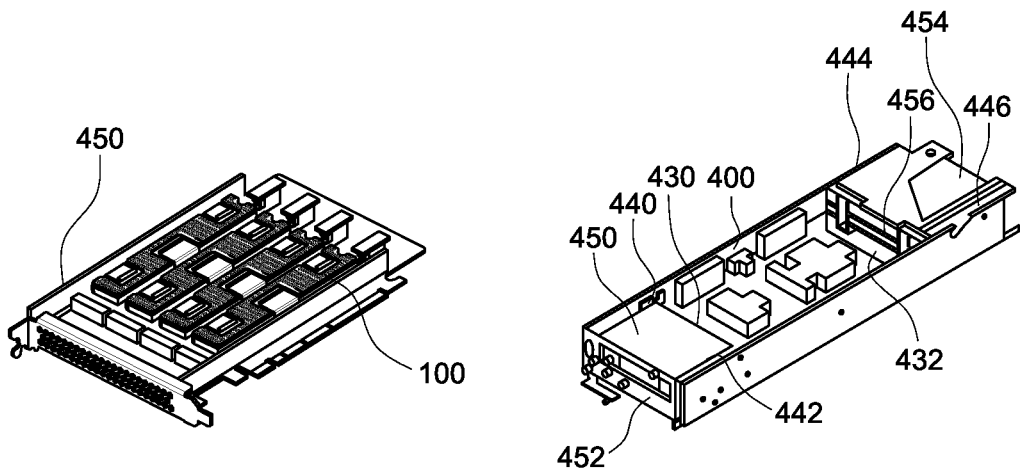
FIG. 4B is the example server sled in FIG. 4A with installed expansion cards.

FIG. 4A is a perspective view of an example chassis sled 400 for a computing system such as a server. FIG. 4B shows the example chassis sled 400 with riser boards and expansion cards, the expansion cards being similar to the card 300 in FIG. 3A. It is understood that multiple sleds such as the sled 400 may be inserted in a chassis. The sled 400 includes expansion slots that hold vertical riser boards to position expansion cards such as the expansion card 300 in FIG. 3A.

In this example, the sled 400 includes a motherboard 410 that mounts two processors under heatsinks 412 and 414. A series of DIMM cards 416 are mounted to the sides of the processors. In this example, the chassis includes four PCIe slots 420, 422, 424 and 426. A front bay 430 includes the PCIe slots 420 and 422 on the motherboard 410 located on the sides of the front bay 430. A rear bay 432 includes the PCIe slots 424 and 426 on the motherboard 410 located on the sides of the rear bay 432.

In this example, a riser board 440 is inserted in the PCIe slot 420. The riser board 440 has an edge connector that is inserted into the slot 420. The riser board 440 includes a card connector that is near the top of the riser board 440 to hold an expansion card, such as the card 300 in FIG. 3A. Similarly, a riser board 442 is inserted in the PCIe slot 422. The riser board 442 has an edge connector that is inserted into the slot 422. The riser board 442 includes a card connector that is near the middle of the riser board 442 to hold an expansion card. Thus, the two expansion cards in the front bay 430 are stacked on each other, and therefore may be full length cards that extend across the width of the sled 400.

Similarly, a riser board 444 is inserted in the PCIe slot 424. The riser board 444 has an edge connector that is inserted into the PCIe slot 424. The riser board 444 includes a card connector that is near the top of the riser board 444 to hold an expansion card such as the card 300 in FIG. 3A. Similarly, a riser board 446 is inserted in the PCIe slot 426. The riser board 446 has an edge connector that is inserted into the slot 426. The riser board 446 includes a card connector that is near the middle of the riser board 446 to hold an expansion card. Thus, the two expansion cards in the rear bay 432 are stacked on each other and therefore may be full length cards that extend across the width of the sled 400.

FIG. 4B shows the sled 400 with four expansion cards 450, 452, 454, and 456, attached to the different riser boards 440 and 442 in the front bay 430, and the riser boards 444 and 446 in the rear bay 432. The example expansion card 450 shown in an enlarged view is identical to the expansion card 300 in FIG. 3A, and holds four M.2 storage carriers such as the carrier 100 in FIG. 1A. In this example all four expansion cards 450, 452, 454, and 456 include four SSD storage carriers such as the carrier 100 in FIG. 1A.

Figure 5A:
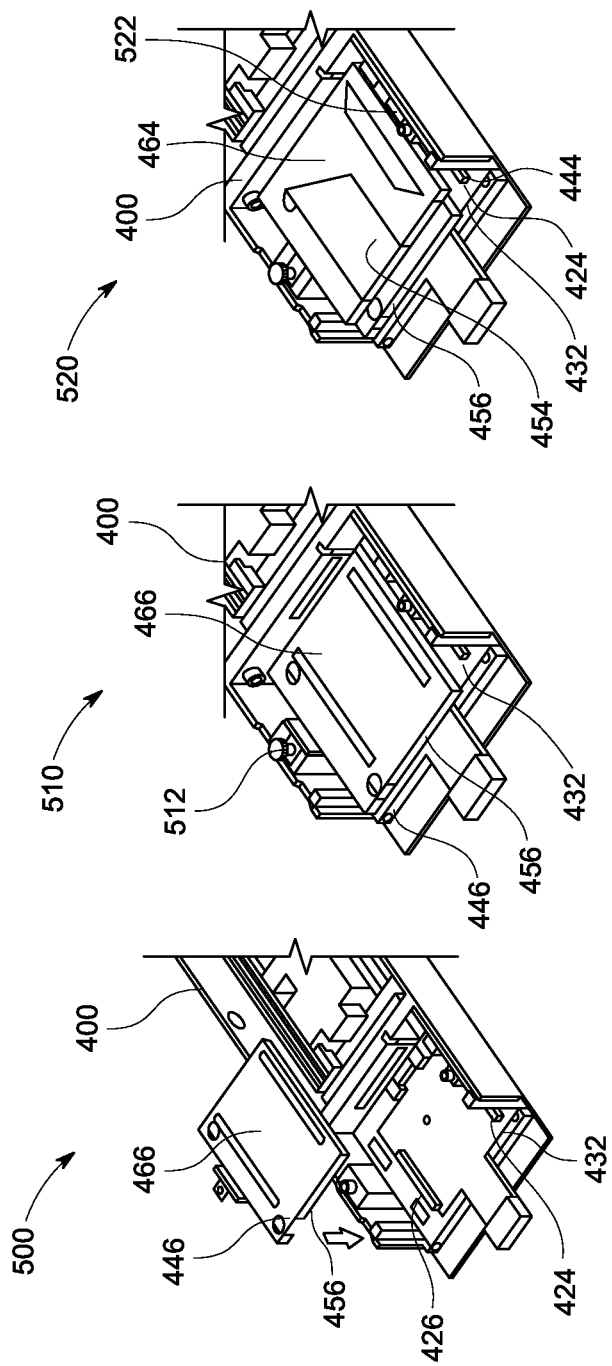
FIG. 5A shows the process of attaching expansion cards in the rear bay of the sled in FIG. 4A.

FIG. 5A shows the process for installing the two expansion cards 454 and 456 in the rear bay 432 of the server sled 400. A first view 500 shows the rear bay 432 with the PCIe slots 424 and 426. A bracket 466 is attached to the riser board 446. The expansion card 456 is inserted in the socket of the riser board 446. The expansion card 456 is supported by the bracket 466 and the riser board 446. The combined riser board 446, bracket 466, and expansion card 456 as shown in a second view 510, may then be inserted in the rear bay 432. Specifically, this allows for the insertion of the edge connector of the riser board 446 in the PCIe slot 426. As shown in the second view 510, the riser board 446 and bracket 466 locates the expansion card 456 at a level about half the height of the sled 400. In this example, an attachment device such as a thumbscrew 512 may be employed to secure the bracket 466 to the sled 400.

A third view 520 shows the attachment of another bracket 464 that is connected to the riser board 444. The edge connector of the riser board 444 is inserted in the PCIe socket 424. The riser board 444 supports the expansion card 454 at the top of the sled 400. An attachment device such as a thumbscrew 522 is employed to secure the bracket 464 to the sled 400. In this example, the brackets 464 and 466 each have a horizontal panel than spans the width of the rear bay 432. Both brackets 464 and 466 have a side vertical edge that may be attached by the respective thumbscrews 512 and 522 to a registration feature on the sides of the rear bay 432.

Figure 5B:
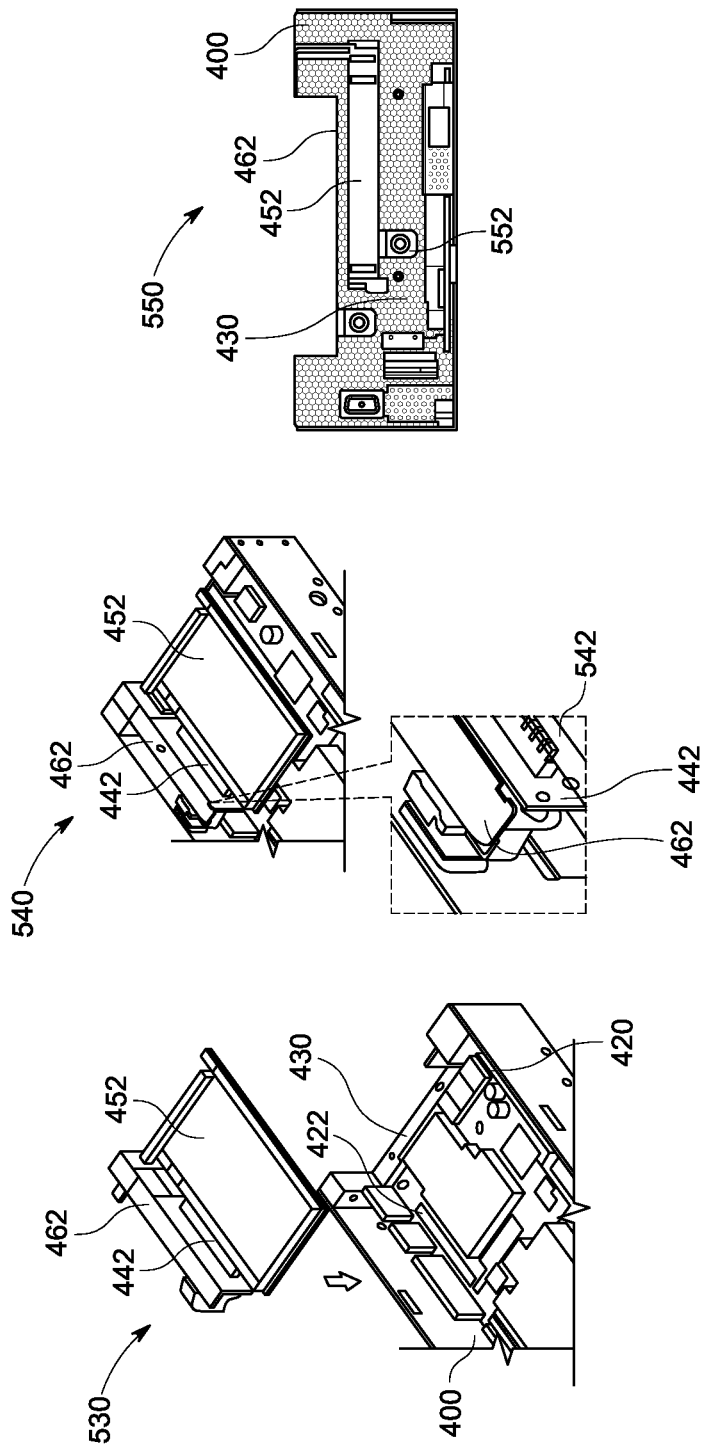
FIGS. 5B-5C shows the process of attaching expansion cards in the front bay of the sled in FIG. 4A.

FIG. 5B shows the process of installing the expansion card 452 in the front bay 430 of the sled 400 in FIG. 4A. A first view 530 shows the front bay 430 with the PCIe slots 420 and 422. A bracket 462 is attached to the riser board 442. The expansion card 452 is inserted in the socket of the riser board 442. The expansion card 452 is supported by the bracket 462 and the riser board 442. The combined riser board 442, bracket 462, and expansion card 452 as shown in a second view 540, may then be inserted in the front bay 430. Specifically, this allows for the insertion of the edge connector of the riser board 442 in the PCIe slot 422. As shown in a second view 540, the riser board 442 and bracket 462 locates the expansion card 452 at a level about half the height of the sled 400. As shown in an inset view 542, the bracket 462 is slotted into a registration feature on the side of the sled 400. A plunger mechanism is then pushed to lock the bracket 462 to the side of the sled 400. The plunger mechanism thus secures the bracket 462 to the side of the sled 400.

A third view 550 is a front view of the front bay 430 of the sled 400 showing the bracket 462 and expansion card 452 in place. In this example, an attachment device such as a thumbscrew 552 may be employed to further secure the bracket 462 to the sled 400.

Figure 5C:
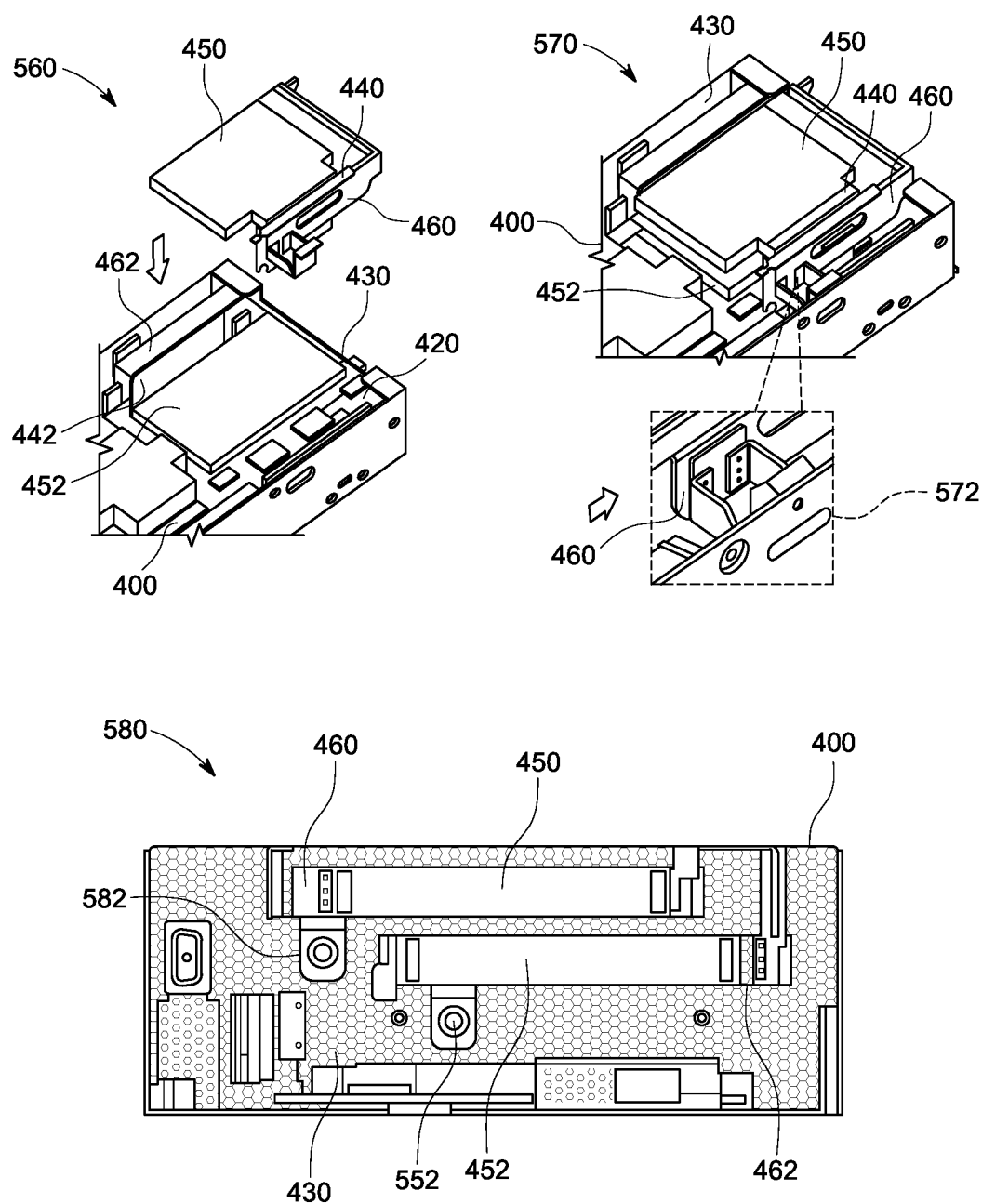

FIG. 5C shows the process of installing the expansion card 450 in the front bay 430 of the sled 400, after installation of the expansion card 452 as shown in FIG. 5B. A first view 560 shows the front bay 430 with the expansion card 452 already installed in the front bay 430. As explained above, the bracket 462 is attached to the expansion card 452 and the riser board 442. These components are all secured to the wall of the front bay 430.

A bracket 460 is attached to the riser board 440. The expansion card 450 is inserted in the socket of the riser board 440. The expansion card 450 is supported by the bracket 460 and the riser board 440. The combined riser board 440, bracket 460, and expansion card 450 as shown in a second view 570, may then be inserted in the front bay 430. Specifically, this allows for the insertion of the edge connector of the riser board 440 in the PCIe slot 420. As shown in the second view 570, the riser board 440 and bracket 460 locates the expansion card 450 at a level at the top of the sled 400. As shown in an inset view 572, the bracket 460 is slotted into a registration feature on the side of the sled 400. A plunger mechanism is then pushed to lock the bracket 460 to the side of the sled 400. The attached card 450 is therefore secured by both the bracket 460 and the inserted riser board 440 to the sled 400.

A third view 580 is a front view of the front bay 430 of the sled 400 showing the bracket 460 and expansion card 450 in place over the previously installed bracket 462 and expansion card 452. In this example, an attachment device such as a thumbscrew 582 may be employed to further secure the bracket 460 to the sled 400. Thus, the two expansion cards 450 and 452 are secured in the front bay 430 in a stacked arrangement.

The example carrier 100 allows a solution to the thermal problem with the heatsink design. The design of the example carrier 100 may be installed easily without any tool in an expansion card such as the expansion card 300 in FIG. 3A. Thus, the usability and thermal optimization and better utilization of such an expansion card in a node sled for a 2U server, a removable M.2 device with a heatsink in the carrier 100, is suitable for a 1U or 2U system. The example M.2 device carrier 100 is compatible with an AVA or full height half length (FHHL) expansion card that can generally hold four such M.2 type device cards. Ideally, the card holds four M.2 22110 type carrier with additional high thermal design power (TDP).

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A carrier for an electronic device installable in an expansion card, the carrier comprising:
   a top heat sink;
   a bottom heat sink;
   a circuit board including the electronic device seated between the top heat sink and the bottom heat sink; and
   a first side clip including a hinge, a top panel and a bottom panel joined to the top panel, the first side clip rotatably coupled to the bottom heat sink by the hinge, the first side clip rotating around the hinge between an open position and a closed position, wherein when the first side clip is in the closed position the top panel of the first side clip contacts the top heat sink, and the bottom panel of the first side clip contacts the bottom heat sink holding the top heat sink to the bottom heat sink, and wherein when the first side clip is in the open position, both the top panel and the bottom panel are rotated away from the bottom heat sink.

2. The carrier of claim 1, wherein the top heat sink includes an exterior surface having a plurality of fins.

3. The carrier of claim 1, wherein the top heat sink includes a first edge having a cutout mateable to a latch on the expansion card, and a second edge including a circuit connector mateable with a connector socket on the expansion card.

4. The carrier of claim 1, wherein the top heat sink and the bottom heat sink are fabricated from aluminum alloy.

5. The carrier of claim 1, wherein the circuit board is compliant with an M.2 form factor.

6. The carrier of claim 1, wherein the electronic device is a solid state drive (SSD).

7. The carrier of claim 1, further comprising a second side clip located on the opposite side of the first side clip, wherein the second side clip has an open position and a closed position, and wherein when the second side clip is in the closed position the top panel of the second side clip contacts the top heat sink, and the bottom panel of the second side clip contacts the bottom heat sink, wherein the second side clip holds the top heat sink to the bottom heat sink.

8. The carrier of claim 1, further comprising:
   a top thermal pad between the circuit board and the top heat sink; and
   a bottom thermal pad between the circuit board and the bottom heat sink.

9. The carrier of claim 1, wherein the bottom heat sink includes two side walls, wherein the side walls are arranged to hold the circuit board in a lateral orientation.

10. The carrier of claim 1, wherein the top heat sink includes a recess having the same shape as the top panel, and wherein the bottom heat sink includes a recess having the same shape as the bottom panel, wherein when the first side clip is in the closed position, the top panel rests in the recess of the top panel and the bottom panel rests in the bottom panel of the bottom heat sink.

11. An expansion card for insertion in an expansion slot of a server sled, the card comprising:
   a support board;
   a connector socket on one side of the support board; and
   a latch member on the opposite side of the support board, wherein the connector socket and latch member accommodate an M.2 compliant carrier of an electronic device, the carrier including:
- a top heat sink;
- a bottom heat sink;
- a circuit board including the electronic device seated between the top heat sink and the bottom heat sink; and
- a first and second side clip, each of the side clips including a hinge, a top panel and a bottom panel, the side clips rotatably coupled to the bottom heat sink by the hinge, the side clips rotating around the hinge between an open position and a closed position, wherein when the side clips are in the closed position the top panel of the side clips contact the top heat sink, and the bottom panel of the side clips contact the bottom heat sink, holding the top heat sink to the bottom heat sink, and wherein when the first side clip is in the open position, both the top panel and the bottom panel are rotated away from the bottom heat sink.

12. The expansion card of claim 11, wherein the support board includes an edge connector for connection to the expansion slot on the server sled.

13. The expansion card of claim 12, wherein the expansion slot is a PCIe slot.

14. The expansion card of claim 11, wherein the top heat sink includes a first edge having a cutout, and a second edge including a circuit connector mateable to the connector socket.

15. The expansion card of claim 14, wherein the latch member includes a slidable latch that engages the cutout of the top heat sink.

16. The expansion card of claim 11, wherein the top heat sink and the bottom heat sink are fabricated from aluminum alloy.

17. The expansion card of claim 11, wherein the electronic device is a solid state drive (SSD).

18. The expansion card of claim 11, wherein the carrier further includes: a top thermal pad between the circuit board and the top heat sink; and a bottom thermal pad between the circuit board and the bottom heat sink.

19. The expansion card of claim 11, wherein the bottom heat sink includes two side walls, the side walls arranged to hold the circuit board in a lateral orientation.

20. The expansion card of claim 11, wherein the top heat sink includes a recess having the same shape as the top panel, and wherein the bottom heat sink includes a recess having the same shape as the bottom panel, wherein when the first side clip is in the closed position, the top panel rests in the recess of the top panel and the bottom panel rests in the bottom panel of the bottom heat sink.

* * * * *